United States Patent

Skipper

(10) Patent No.: US 9,553,579 B2
(45) Date of Patent: Jan. 24, 2017

(54) OPTICAL KEYPAD FOR EXPLOSIVE LOCATIONS

(71) Applicant: PR Electronics A/S, Rønde (DK)

(72) Inventor: Bjarne Funch Skipper, Odder (DK)

(73) Assignee: PR Electronics A/S, Rønde (DK)

( * ) Notice: Subject to any disclaimer, the term of this patent is extended or adjusted under 35 U.S.C. 154(b) by 0 days.

(21) Appl. No.: 14/964,630

(22) Filed: Dec. 10, 2015

(65) Prior Publication Data

US 2016/0173087 A1   Jun. 16, 2016

(30) Foreign Application Priority Data

Dec. 10, 2014   (DK) .................................. 2014 70771

(51) Int. Cl.
| | |
|---|---|
| *H03K 17/94* | (2006.01) |
| *H03M 11/00* | (2006.01) |
| *G01V 8/20* | (2006.01) |
| *G06F 3/042* | (2006.01) |
| *H03K 17/96* | (2006.01) |

(52) U.S. Cl.
CPC ............... *H03K 17/943* (2013.01); *G01V 8/20* (2013.01); *G06F 3/0421* (2013.01); *H03K 17/9636* (2013.01); *H03K 2217/94116* (2013.01)

(58) Field of Classification Search
CPC .............. H03K 17/943; H03K 17/9636; H03K 2217/94116; G01V 8/20; G06F 3/0421
See application file for complete search history.

(56) References Cited

U.S. PATENT DOCUMENTS

| | | | |
|---|---|---|---|
| 4,254,333 A | 3/1981 | Bergström | |
| 5,355,149 A | 10/1994 | Casebolt | |
| 8,057,046 B2 * | 11/2011 | Hatanaka | G02B 5/10 |
| | | | 353/31 |
| 2004/0251402 A1* | 12/2004 | Reime | H03K 17/9631 |
| | | | 250/221 |
| 2005/0270458 A1 | 12/2005 | Ishikawa et al. | |
| 2015/0084739 A1 | 3/2015 | Lemoult et al. | |

FOREIGN PATENT DOCUMENTS

| | | |
|---|---|---|
| CN | 202584024 U | 12/2012 |
| DE | 31 46 152 A1 | 6/1983 |
| DE | 40 34 828 C1 | 1/1992 |
| DE | 10 2007 008 007 A1 | 8/2008 |
| DE | 10 2011 081 487 A1 | 2/2013 |
| DE | 10 2012 011 256 A1 | 12/2013 |
| EP | 0 551 240 A1 | 7/1993 |
| EP | 1 400 918 A1 | 3/2004 |
| FR | 2 621 192 A1 | 3/1989 |
| WO | 2008/004101 A2 | 1/2008 |
| WO | 2012/172363 A2 | 12/2012 |
| WO | 2013/081671 A1 | 6/2013 |
| WO | 2013/156353 A1 | 10/2013 |

* cited by examiner

*Primary Examiner* — Erin File
(74) *Attorney, Agent, or Firm* — David S. Safran

(57) ABSTRACT

An optical keypad for use in hazardous areas and which can ensure safe and reliable detection of keystrokes through an at least 8 mm thick glass window, as is required for electronics equipment located in hazardous explosive areas (In accordance with ATEX Directive 94/9/EC and similar requirements) is obtained by providing a system in which at least 6 LEDs are lit in a pseudo-random sequence, modulated by a pseudo-random frequency and the interval between the lighting of each of the LEDs is change randomly to avoid interference between collocated keypads and light from other sources, such as daylight and artificial light.

7 Claims, 8 Drawing Sheets

1A

| LED 1 | LED 2 | LED 3 | LED 4 | LED 5 | LED 6 | Result |
|---|---|---|---|---|---|---|
| + | + | - | - | - | - | Key 1 |
| - | - | + | + | - | - | Key 2 |
| + | + | - | - | + | + | Key 3 |
| - | - | + | + | + | - | Key 1 and 2 |
| + | + | + | - | + | + | Key 2 and 3 |
| - | - | - | + | - | - | Key 1 and 3 |

Figure 8

OPTICAL KEYPAD FOR EXPLOSIVE LOCATIONS

BACKGROUND OF THE INVENTION

Field of the Invention

The present patent application relates to an optical keypad comprising at least one transparent panel comprising a plurality of apertures surrounded by closed areas, which optical keypad comprises a plurality of light-emitting diodes (LEDs) emitting modulated light and at least one receiving photo diode placed in relation to the apertures, which light from the transmitting LEDs is transmitted through the transparent panel and which light is reflected by scattering from a tool or fingertip employing a keystroke in relation to one of the apertures in the transparent panel, which reflected modulated light is transmitted back through the transparent panel and back to the receiving photo diode for demodulation.

Description of Related Art

International Patent Application Publication WO 2013/156353A1, filed on 10 Apr. 2013, having priority date on 18 Apr. 2012, entitled "Keypad assembly and method to access a car" and corresponding U.S Patent Application Publication US 2015/0084739 relate to a key-less access system for cars based on a simple detection of visible light though the windscreen. The publications WO 2013/156353A1 and US 2015/0084739 disclose an amplitude modulation of the transmitted light and amplitude demodulation of received signals.

U.S. Pat. No. 4,254,333 disclose an optoelectronic circuit element for effecting a manually controlled output signal comprising at least one radiation-emitting element, a radiation-propagating unit and at least one radiation-sensitive element, the radiation-propagating unit being a solid body which is transparent to the radiation in question and which has an interface which is exposed to radiation from the radiation-propagating unit, an identifiable change in the state of the radiation-sensitive element is affected by changes in the conditions for total internal reflection of the radiation at the interface arising from contact of an actuating body, say a finger, with said interface.

SUMMARY OF THE INVENTION

It is a primary object of the present patent application to achieve a reliable and secure keypad.

A further object is to achieve a keypad for field mounted devices in hazardous environments.

Another object is to avoid cross-talk or interference from collocated keypads.

Still a further object is to avoid distortion from smooth and shiny surfaces and from daylight and artificial light.

The above objects can be fulfilled by a keypad comprising at least one transparent panel having a plurality of apertures surrounded by closed areas, which optical keypad comprises a plurality of light transmitting diodes (LEDs) emitting modulated light and at least one photo detector diode placed in relation to the apertures, which light from the LEDs is transmitted through the transparent panel and is reflected by scattering from a tool or fingertip producing a keystroke in relation to one of the apertures in the transparent panel, which reflected light is transmitted back through the transparent panel and back to the photo detector diode for demodulation, and further modified by the emitted modulated light from each LED being controlled by at least a combination one of the following parameters:

a: Modulation frequency of the emitted light from the LEDs
b: The sequence in which the LEDs are lit,
c: The time interval between lighting of the individual LEDs
where the at least one parameter is varied randomly, and where the detection of the reflected light is performed by a synchronous detection of the current flowing through the receiver photo diode, which detection compares the randomly received signal with the randomly coded signal transmitted from the LEDs.

In this manner, a highly reliable keypad can be achieved in which up to three different parameters may be randomly modulated. The modulation may also be pseudo random. This can have the effect that even though several detections of modulated light pulses per second are performed, it will take weeks before the same combination of modulated light is repeated. The effect of this is that, even though a plurality of keypads operate very close to each other, it is most improbable that there will be any interference between them. Keypads can probably operate side by side for several years before they will transmit the same modulation. In addition, another effect is that it is almost impossible that any disturbance of light from the outside will have the same modulation. Consequently, a highly reliable keypad is achieved.

In a preferred embodiment of the invention, the detection system disclosed in this patent application can be based on one infrared receiver photo diode and at least six transmitter LEDs to obtain three keypads. The invention can use three pseudo-random scrambling methods in combination with modulation of the transmitted light and synchronous detection of the received light to obtain resistance against unintended light from surroundings and to avoid crosstalk between collocated optical keypads.

The present invention relates to a keypad suitable for use in explosive atmospheres (ATEX) or hazardous areas, comprising at least 6 infrared light-emitting diodes (LEDs) and one infrared photo detector diode to enable a reliable, safe and secure detection of one keystroke out of at least three keys.

Field-mounted electronics located in ATEX/explosive areas must comply with the ATEX Directive 94/9/EC for equipment used in the EEC, and the corresponding UL/CSA certification when used in the United States of America and Canada. For displays, a window of minimum 8 mm thickness is required to obtain the certifications for use in hazardous areas.

In a further preferred embodiment of the invention the light transmitted from the LEDs can be filtered with respect to optical polarization to one state of polarization, and the light incident on the photo detector is filtered to the perpendicular state of polarization relatively to the transmitted light in order to avoid that reflection from smooth and plane surfaces disturbs the detection of a scattered reflection from a tool or fingertip causing a keystroke. Hereby it is achieved that only light that is reflected from tool or fingertip has a change in polarization, and only light with perpendicular orientation will be received by the receiver photo diode. Hereby it is achieved that any cross coupling from other of the light emitting LEDs or from external light sources or from daylight is avoided. By using a glass panel, a plurality of reflections can occur between surfaces of the glass whereby light can disturb the measurement of a keystroke, but only light with change in the polarization can pass the polarization filter and be detected at the received LED.

In a further preferred embodiment of the invention, the light incident on the photo detector can be filtered with respect to only the infrared wavelength range, which matches the emission wavelength of the LEDs in order to reduce the amount of daylight and artificial light incident on the receiver photo diode. By a simple optical filtration it is possible to select wavelengths from the infrared spectrum, but as LEDs by default are limited to emit light in a relatively narrow spectrum, it is possible to select LEDs which only emit infrared light. In this way, the infrared spectrum can be achieved in a highly efficient manner. To a very large extent, influence from daylight and also from artificial light hitting the keypad is thereby avoided. In an alternative embodiment of the invention, it should also be possible to select light from the ultraviolet spectrum in a keypad as previously disclosed.

In a further preferred embodiment of the invention, the keystroke detection can be based on an adaptive gain-adjusting functionality and/or an adaptive detection threshold to account for the varying performance of the optical components, and to account for variable reflections from the transparent panel surfaces due to dust and/or moisture present on the glass surfaces. Hereby, it can be achieved that any influence from change in external parameters, but also influence from change in the transmitting LEDs or the receiving photo diode, is avoided simply because gain and/or detection threshold adjustment is automatic. In this way, it can also be avoided that keypads must be adjusted in any way due to the actual need. Because the keypad performs automatic gain and/or detection threshold adjustment, the influence from change in light, such as daylight or artificial light that changes its level or its color temperature, will mostly be eliminated, and thus, it will not have any influence on the detected signal due to the gain and threshold adjustment. The system is designed in such a way that a noise level is measured at the receiving photo diode in time periods when no light is reflected from the transmitting LEDs, and by this measurement the correlated noise level without reflected light is subtracted from the measured level. Thereby, the major part of the noise contribution is eliminated.

In a further preferred embodiment of the invention, the adaptive gain adjustment can be performed by adjusting the amount of light emitted from the transmitting LEDs and/or the integration time in the analog synchronous detection at the receiving photo diode. In a further preferred embodiment of the invention the light can be selected in the non-visual spectrum of light, and the transparent panel is covered with a filter to avoid that daylight interrupts the receiving LED. Hereby, a relatively small spectrum of light outside the visible spectrum can be used. In this way, it will be possible to use infrared as well as ultraviolet light. Hereby it can be avoided that any light of the visible spectrum can have influence on the keypad detection.

The present patent application further discloses a method for operating a keypad, as previously disclosed in the following sequence of steps:

a: prepare a train of light pulses,
b: prepare random modulation of the train of light pulses,
c: select one or more of the following parameters for random modulation,
   modulation frequency of the light emitted from the transmitting LEDs,
   the sequence in which the transmission LEDs are lit, and
   the time interval between lighting of the individual transmission LEDs,
d: perform emission of the randomly modulated light by one or more of the individual LEDs,
e: let the optical receiving photo diode receive the reflected light,
f: perform signal conditioning, amplification and synchronous detection of the received optical signal
g: by comparison of the detected signal and the adaptive adjusted threshold level, evaluate whether a reflection or no reflection has been present for the individual LEDs and,
h: on the basis of the evaluation and the truth-table in FIG. 8 decide whether a keystroke has been performed or not.

Hereby, a very reliable keypad can be achieved. This keypad is very reliable rejecting the influence from unwanted light such as daylight or artificial light. Furthermore, it can be achieved that different keypads will not interfere with each other.

Use of a keypad as disclosed fulfils ATEX Directive 94/9/EC for equipment used in the EEC and the corresponding UL/CSA certification when used in the United States of America and Canada. Hereby, a keypad is achieved which will be very reliable in all outdoor and indoor installations. Also in hazardous indoor environments, e.g., mechanical, medical or chemical production areas, this keypad will be highly efficient as its surface is a relatively thick plate of glass which is not affected by most chemicals, nor affected by dirt and/or moisture due to the adaptive gain and threshold functionality.

The invention can be, but is not limited to, a keypad with which it is possible by optical detection to obtain a keystroke though a glass window of at least 8 mm thickness, which comply with the ATEX requirements, see FIG. 1. The LED transmits modulated light though an aperture, which can be a printed circuit board (PCB) but is not limited to a PCB, which transmits light through a filter, which transmits light through the glass window. In case of a keystroke where a finger is very near to the glass surface or on the glass surface, light from the finger will be reflected and transmitted through the glass window, and further through the filter and through the aperture and to the receiving photo diode.

A scrambling methodology is based on pseudo-random change of at least one of the following parameters:
   modulation frequency of the light,
   the sequence in which the LEDs are lit, and
   the time interval between lighting of the individual LEDs An integrated adaptive gain functionality is deployed to ensure optimal detection of the keystroke independently of variation in optical performance of the optical components due to ageing and temperature variations, and furthermore to account for slowly changing background reflections due to change in dust and moisture on the surface of the glass window.

The gain variation is performed within the analog signal processing by two means:
a. by reduction of the duty cycle (D) for the LEDs, and
b. by change of integration time within the analog integrators used for the synchronous detection.

For field-mounted equipment located in hazardous areas, legislation requires a glass window having a minimum thickness of 8 mm, e.g., where displays are to be visible from the outside. Keypads will typically be required to configure and adjust the field-mounted displays. A co-location of the functionality of the keypads together with the display beneath the 8 mm thick window is an attractive solution with respect to user interface and mechanical design.

Implementation of keypads based on inductive or capacitive sensing is very challenging when combined with an 8 mm thick glass window, when the keypad need to employ a reliable and secure detection of a keypad stroke.

Furthermore, high immunity to dust and moisture on the outside of the glass surface is required in order to avoid detection of unintended keystrokes.

The present patent application is not limited to any special use because this invention can be used in every keyboard; even keyboards for computer systems can comprise an optical detection system as the one disclosed here. A plurality of transmitting LEDs and a plurality of sensor diodes can be used in a large keyboard.

By the described technology, a reliable and secure keypad stroke detection in field-mounted devices located in hazardous areas can be achieved. Furthermore, the technology concerns a design which ensures reliable keypad stroke detection by a three-dimensional scrambling method to avoid cross-talk between or interference from co-located keypads. Furthermore, the invention can use frequency modulation of the light in combination with a synchronous detection technique of the light received by the receiving photo diode in order as to eliminate distortion from daylight and artificial light.

Definition of "daylight": Light generated by the sun passing the atmosphere and received outside or inside buildings is hereby defined as "daylight"

Definition of "artificial light": Light generated from artificial light sources are defined as "artificial light"

BRIEF DESCRIPTION OF THE DRAWINGS

FIG. 8 discloses a truth table for keystroke detection.

DETAILED DESCRIPTION OF THE INVENTION

In the following text, the figures will be described one by one and the different parts and positions seen in the figures will be numbered with the same numbers in the different figures. Not all parts and positions indicated in a specific figure will necessarily be discussed together with that particular figure.

Figure 1:
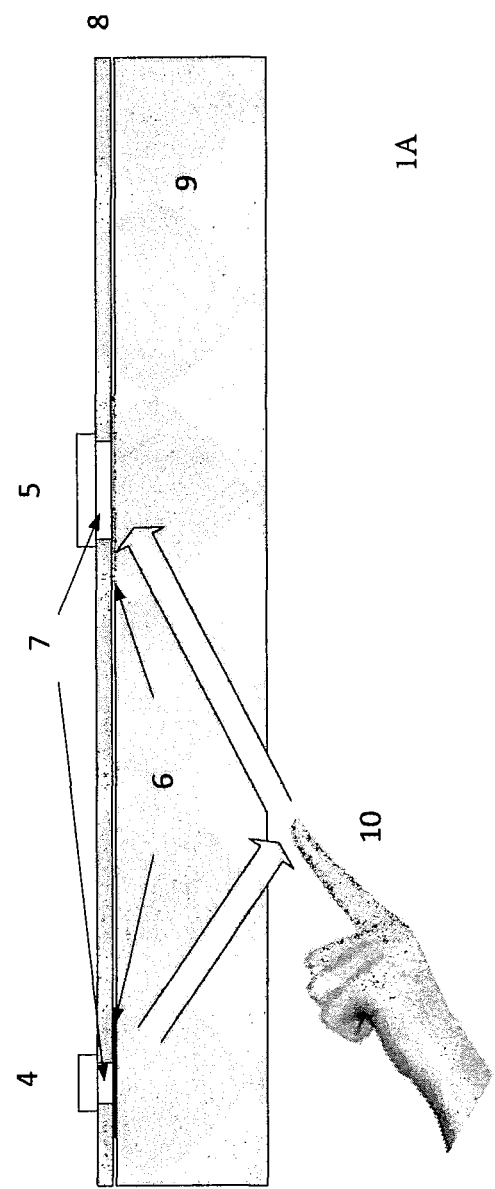
FIG. 1 discloses the basic principle of stroke detection.

FIG. 1 discloses the general functionality of the optical keypad, LEDs 4 are transmitting light through an aperture 7, through a filter 6, through a glass window 9, the light incident on the fingertip 10 will be scattered due to rough surface of the finger, some light will be reflected back through the glass window, through the filter 6, through the aperture 7, and when the light hits the receiving photo diode 5, it will cause a current to flow in the receiving photo diode 5. When a finger is present in front of the glass window, the amount of reflected light incident on the receiving photo diode will increase compared to the situation without the finger.

Figure 2:
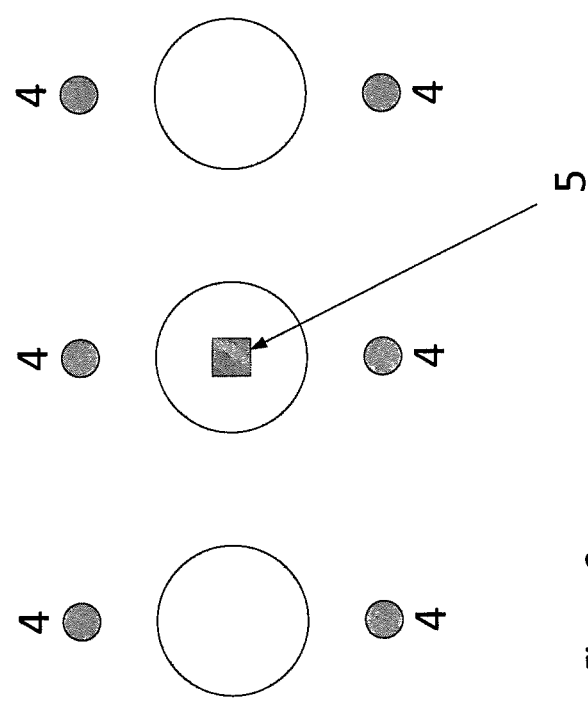
FIG. 2 discloses the layout of the three buttons relative to the physical location of LEDs and photo detector.

FIG. 2 discloses a possible layout for a Keypad. This keypad indicates three bottoms 1, 2, 3, as the active area for the three keys. Further indicated are six transmitting LEDs 4 and a receiving photo diode 5. The six LEDs generate light and this light can be detected at the receiving photo diode 5. By pressing a finger to one of the bottoms 1, 2, 3, the light reflected at the inner side of the keypad surface is changed and the change in reflected light is detected at the receiving photo diode 5.

Figure 3:
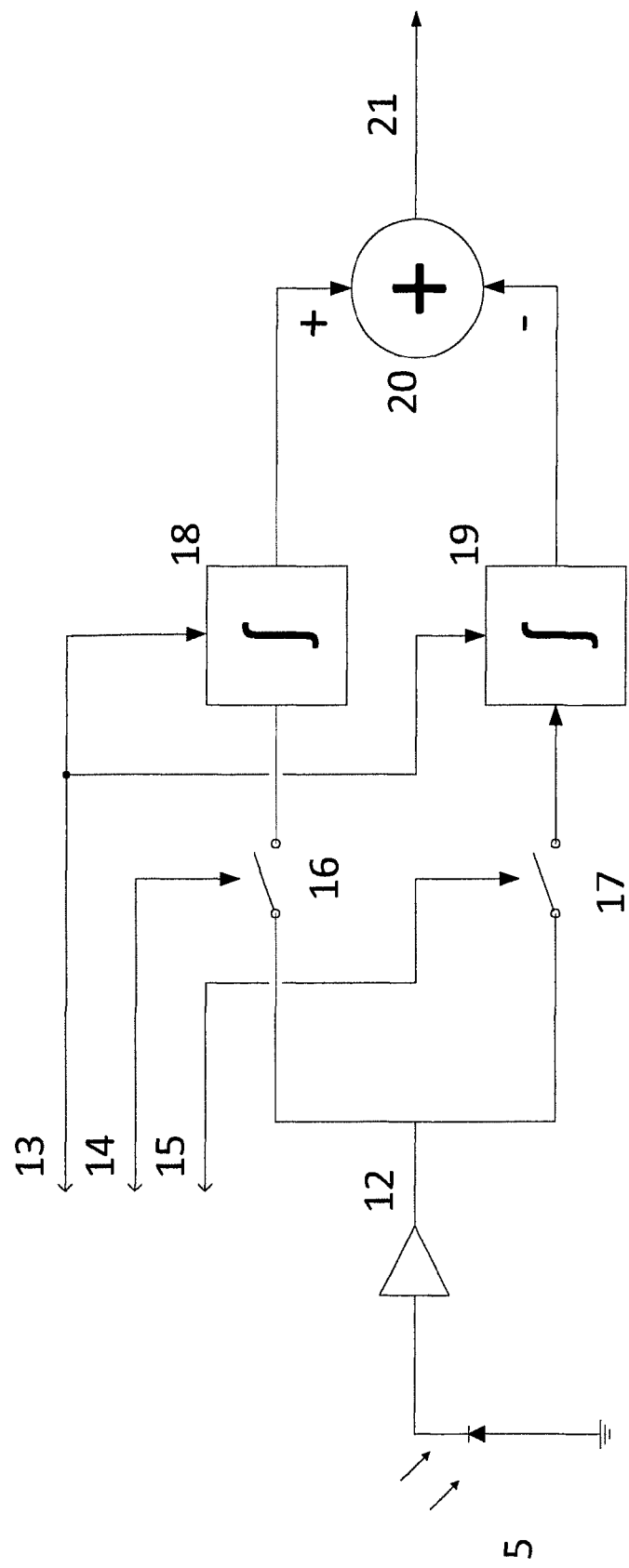
FIG. 3 discloses the design of the analog synchronous detection system where the light reflected from LEDs will be detected by the receiving photo diode (11) and the synchronously detected signal will be present at 21 for further processing as disclosed in FIG. 4.

FIG. 3 discloses the basic implementation of the synchronous demodulation. The transmitting LEDs are lit successively by applying a burst of e.g., 100 injection current pulses, whose repetition rate is determined by the frequency chosen for the particular transmitting LEDs. By a reflected optical signal incident on the receiving photo diode 5, the transimpedance amplifier 12 converts the receiving photo diode 5 current into a voltage at the output of the amplifier 12. The amplifier output is fed to two integrators by switches 16,17, which are turned on in synchronization with the current pulses fed to the transmitting LEDs. Switch 16 feeds the signal into the integrator 18 in the period when the signal from the receiver is at its maximum due to the reflected light, and switch 17 feeds the signal into the integrator 19 in the period when the signal from the receiver is at minimum, equal to the period where no light is incident on the receiving photo diode. Subtracting the two integrator signals 20 yields a signal 21, which is proportional to the amount of reflected transmission LED light. After the burst of transmission LED injection currents, the subtracted integrator signals are investigated by an analyzing system, e.g., a microcontroller. After the signal from one transmission LED has been analyzed, the two integrators 18 and 19 are reset by the signal 13. After reset, the integrators are ready for analyzing reflection from another transmission LED.

Using the synchronous detection principle in combination with the scrambling technology eliminates the effect of other light sources, whether they are related to enlightening the surrounding areas or are from collocated keypads.

The scrambling technology is based on pseudo-random change of the modulation/burst frequency, the sequence in which the 6 individual LEDs are lit, and the time interval between the burst of each of the 6 individual LED.

Figure 4:
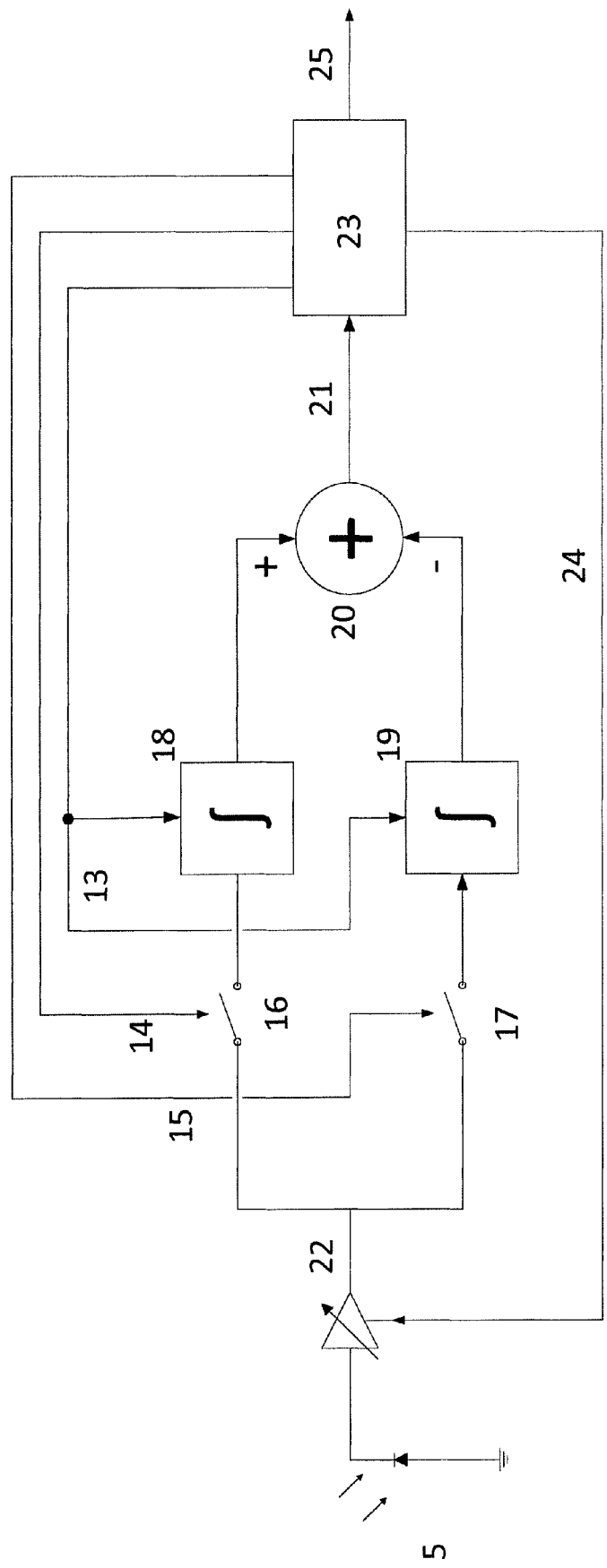
FIG. 4 discloses the design of the analog synchronous detection system, where adaptive gain and threshold level functionality is implemented and controlled by a microprocessor-based detection system.

FIG. 4 discloses an adaptive synchronous detection system, where the analyzing system 23 can be implemented by a microcontroller or by a field-programmable gate array (FPGA), which on the basis of the investigated signal 21 can perform an adaptive gain adjustment. The function of the adaptive gain adjustment is to compensate for variations in the performance of the optical components due to ageing and temperature. Furthermore, the gain adjustment compensates for variations in the optical path from the LEDs 4 to the photo detector 5, due to e.g., dust and moisture on the glass surfaces.

The overall gain is adjusted by three means: the duty cycle of the LED burst current, the gain of the transimpedance amplifier, and the gain of the integrators.

By adjusting the duty cycle D of the LEDs (4), the optical power per pulse can be adjusted and thereby the amount of reflected optical incident light on the photo detector to obtain an appropriate level for the photo detector to achieve a suitable signal-to-noise ratio.

By adjusting the gain of the transimpedance amplifier, the signal for the synchronous detection can be adjusted.

By adjusting the duty cycle of the signals controlling the integration period 14, 15, the gain of the integrator can be adjusted.

Figure 5:
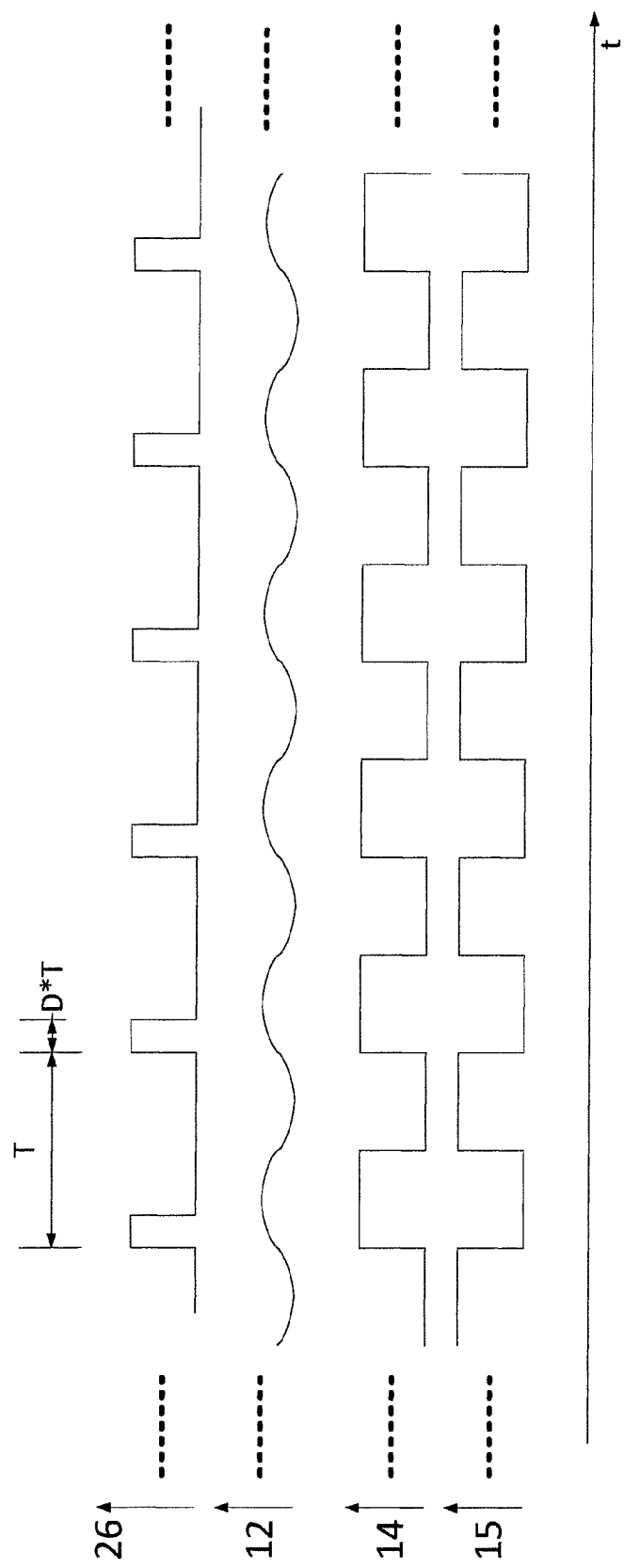
FIG. 5 discloses the timing between the signals driving the transmitting LEDs and the corresponding signals within the synchronous detection.

FIG. 5 discloses the timing of signals in the synchronous detection scheme in which 26 is the current within one of the LEDs 4, 12 is signal out of the transimpedance amplifier, 14 is the control signal for switch 16, and 15 is control signal for switch 17. Integrator 18 will only integrate when the signal is at high level (switch 16 feeding signal) and integrator 19 will only integrate when the signal is at low level (switch 17 feeding signal).

Figure 6:
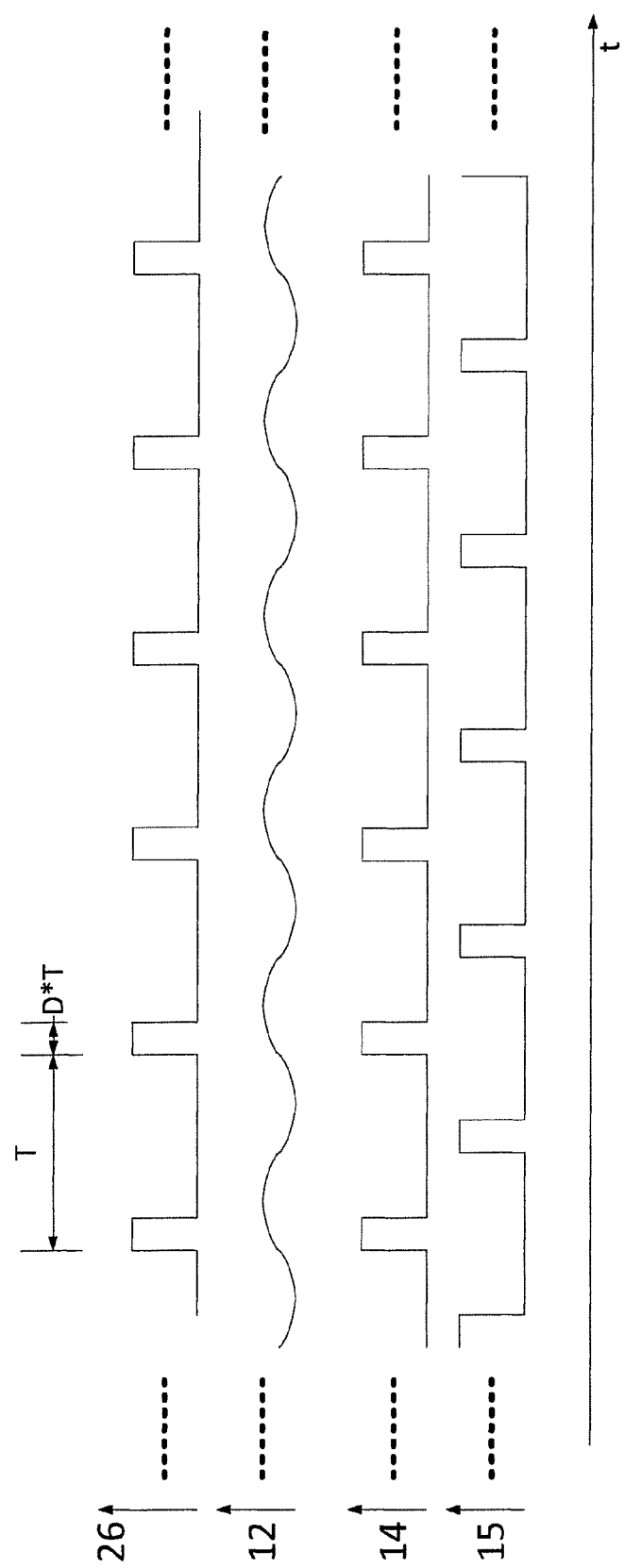
FIG. 6 discloses the timing between signals with a reduced gain within the integrators deployed by reduction of the time when integration is performed, i.e., the time when the integrator switches are open.

FIG. 6 discloses the timing of signals in the synchronous detection scheme when the integrator gains have been reduced by reducing the on-time of the two switches 18 and 19.

Figure 7:
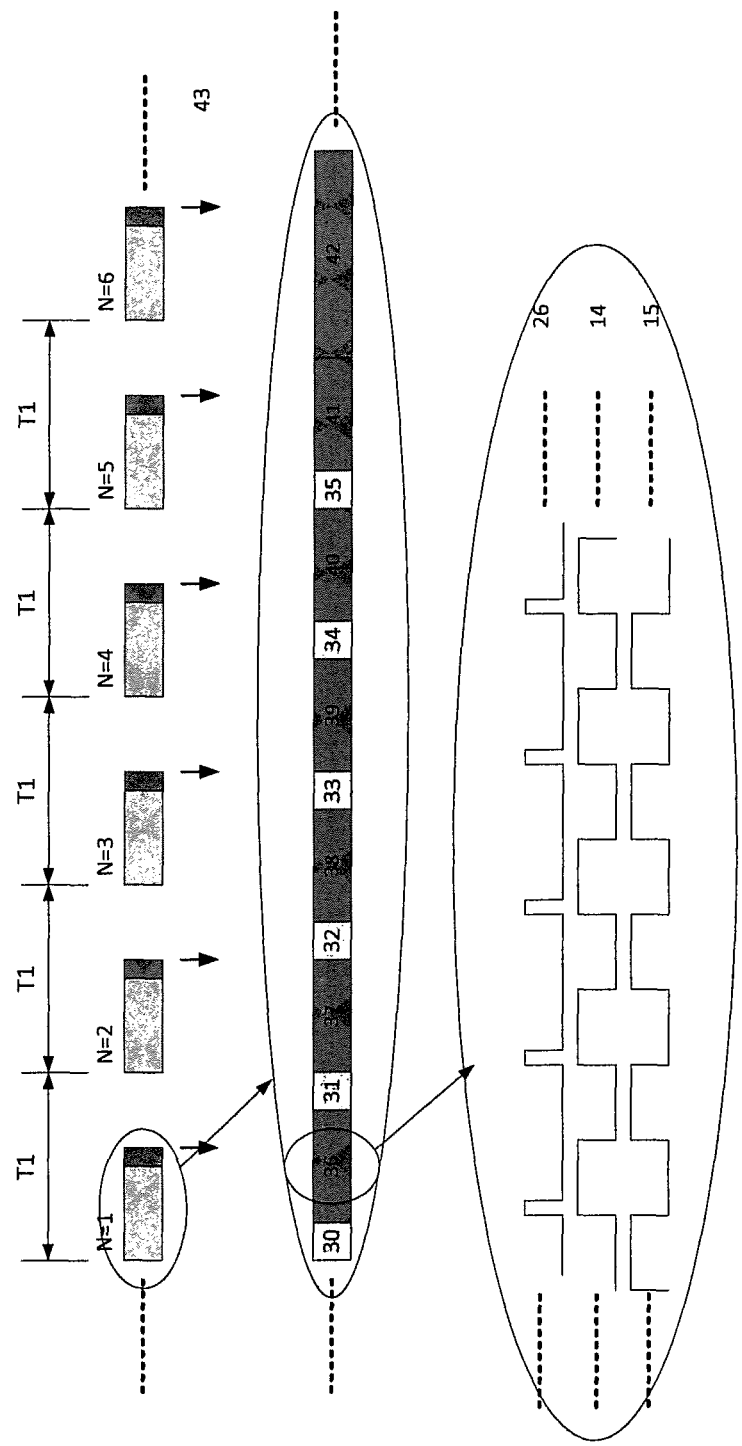
FIG. 7 discloses the full timing schedule of the keypad investigation.

FIG. 7 discloses the timing of the total keypad analyzis. For each time T1, a full analysis will be performed, which includes 6 pseudo-random delays 30-35 and lighting of the 6 LEDs 36-41 is performed in a pseudo-random sequence. In addition, the modulation frequency of each LED is changed pseudo-randomly. The signals 26, 14 and 15 are identical to the signals shown in FIG. 5.

FIG. 8 discloses the truth table for a keystroke detection. A where "+" in the table indicates that a reflection from the LEDs has been detected. All other reflection combinations other than that given in FIG. 8 are erroneous cases, and they will not be detected as a keystroke. To avoid that flaws or detected noise are accepted as keystroke, two identical results in the truth table (FIG. 8) have to be obtained from at least two successive scans (N=x and N=x+1).

What is claimed is:

1. An optical keypad, comprising:
   at least one transparent panel having a plurality of apertures surrounded by closed areas, which optical keypad comprises a plurality of light transmitting diodes (LEDs) emitting modulated light and at least one photo detector diode placed in a relation to the apertures that enables light from the LEDs to be transmitted through the transparent panel and reflected by scattering from a tool or fingertip producing a keystroke in relation to one of the apertures in the transparent panel, back through the transparent panel to the at least one photo detector diode for demodulation,
   wherein the emitted modulated light from each LED (4) is controlled by a combination of at least one of the following parameters:
   a: modulation frequency of the emitted light from the transmitting LEDs (4)
   b: the sequence in which the transmitting LEDs (4) are lit,
   c: the time interval between lighting of the individual transmitting LEDs (4)
   where at least one of the parameters is varied randomly, and
   where detection of the reflected light is able to be performed by a synchronous detection of current flowing through the at least one photo detector diode (5), and a randomly received signal compared with a randomly coded signal transmitted from the LEDs (4).

2. An optical keypad according to claim 1, wherein filter means is provided for filtering the light generated in the LEDs (4) with respect to optical polarization to one state of polarization, and the light incident on the receiving photo diode (5) filtering to a perpendicular state of polarization relative to the transmitted light in order to avoid reflection from smooth and plane surfaces from disturbing detection of a scattered reflection from a tool or fingertip (10) employing a keystroke.

3. An optical keypad according to claim 2, wherein the light incident on the photo detector is filtered with respect to a wavelength range that matches an emission wavelength of the transmitting LEDs (4) in order to reduce the amount of daylight and artificial light incident on the receiving photo diode (5).

4. An optical keypad according to claim 3, wherein the key pad is configured to perform at least one of adaptive gain adjustment and detection threshold-adjustment of stroke detection to account for the varying performance of the optical components and to account for reflections from the transparent panel (9) surfaces due to the presence of at least one of dust and moisture on the glass surfaces.

5. An optical keypad according to claim 4, wherein the adaptive gain adjustment is performed by at least one of adjusting the amount of light emitted from the LEDs (4) and adjusting the integration time in analog synchronous detection.

6. An optical keypad according to claim 5, wherein the LEDs are constructed to emit light in the infrared spectrum of light, and the transparent panel (9) is covered with a filter which is transparent for light in the infrared range to reduce influence from daylight or artificial light.

7. Method to operate an optical keypad having at least one transparent panel having a plurality of apertures surrounded by closed areas, a plurality of light transmitting diodes (LEDs) emitting modulated light and at least one photo detector diode placed in a relation to the apertures that enables light from the LEDs to be transmitted through the transparent panel and reflected by scattering from a tool or fingertip producing a keystroke in relation to one of the apertures in the transparent panel, back through the transparent panel to the at least one photo detector diode for demodulation, comprising the following sequence of steps:
   a: prepare a train of light pulses from one or more of the individual transmitting LEDs,
   b: prepare random modulation of the train of light pulses,
   c: select one or more of the following parameters for random modulation,
   modulation frequency of light emitted from transmitting LEDs
   a sequence in which transmitting LEDs are lit, and
   a time interval between lighting of transmitting LEDs,
   d: perform transmission of the randomly modulated light by one or more of the individual transmitting LEDs,
   e: let the optical receiver photo diode receive the reflected signal,
   f: perform signal conditioning, amplification and synchronous detection of the received optical signal,
   g: by comparison of the detected signal and the adaptive adjusted threshold level performing an evaluation of whether a reflection or no reflection has been present for the individual LEDs and
   h: on the basis of the evaluation and a truth-table decide whether a keystroke has been performed or not.

* * * * *